United States Patent
Cheng et al.

(10) Patent No.: US 7,372,703 B2
(45) Date of Patent: May 13, 2008

(54) HEAT DISSIPATION STRUCTURE FOR INTERFACE CARD

(75) Inventors: Sheng-Liang Cheng, Taipei (TW); Chi-Wei Tien, Taipei (TW); Jenq-Haur Pan, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 11/307,543

(22) Filed: Feb. 13, 2006

(65) Prior Publication Data

US 2006/0285299 A1 Dec. 21, 2006

(30) Foreign Application Priority Data

Jun. 20, 2005 (TW) .............................. 94120389 A

(51) Int. Cl.
*H05K 7/20* (2006.01)
(52) U.S. Cl. .................... 361/719; 361/704; 165/80.2; 165/80.3; 165/185
(58) Field of Classification Search ............... 361/704, 361/715, 719, 728, 690; 257/724, 723, 726, 257/738; 165/80.3, 80.2, 185; 174/16.3, 174/254, 548, 260
See application file for complete search history.

(56) References Cited

U.S. PATENT DOCUMENTS

| | | | |
|---|---|---|---|
| 6,025,992 A * | 2/2000 | Dodge et al. | 361/704 |
| 6,091,145 A * | 7/2000 | Clayton | 257/724 |
| 6,410,857 B1 * | 6/2002 | Gonya | 174/254 |
| 6,449,159 B1 * | 9/2002 | Haba | 361/707 |
| 6,583,986 B1 * | 6/2003 | Storti et al. | 361/704 |
| 6,765,793 B2 * | 7/2004 | Kehret et al. | 361/690 |
| 7,023,701 B2 * | 4/2006 | Stocken et al. | 361/704 |
| 2003/0076657 A1 * | 4/2003 | Summers et al. | 361/719 |

* cited by examiner

*Primary Examiner*—Boris Chervinsky
*Assistant Examiner*—Courtney L Smith
(74) *Attorney, Agent, or Firm*—Jianq Chyun IP Office

(57) ABSTRACT

A heat dissipation structure configured to couple with an interface card is provided. The heat dissipation structure comprises a first heat conduction portion arranged above a first surface of a wired board of the interface card, a second heat conduction portion arranged above a second surface of the wired board opposite the first surface thereof, and a heat convection portion connecting the first and the second heat conduction portions. Both the first and the second heat conduction portions comprise a plurality of contact leads used to contact the heat-generating electronic components disposed on the two surfaces of the wired board. The heat convection portion has a plurality of first bending strips and a plurality of second bending strips that are alternatively arranged, and a plurality of heat convection slots are formed between the first bending strips and the second bending strips.

17 Claims, 5 Drawing Sheets

HEAT DISSIPATION STRUCTURE FOR INTERFACE CARD

CROSS-REFERENCE TO RELATED APPLICATION

This application claims the priority benefit of Taiwan application serial no. 94120389, filed on Jun. 20, 2005. All disclosure of the Taiwan application is incorporated herein by reference.

BACKGROUND OF THE INVENTION

1. Field of Invention

The present invention relates to a heat dissipation structure. More particularly, the present invention relates to a heat dissipation structure applied in an interface card.

2. Description of Related Art

Nowadays, portable computers, either the notebook computers or the tablet computers, are all developing towards lighter, thinner and smaller designs. However, this trend causes the inner space of the portable computer to become narrower and leads to increased integration level of its inner parts. When the portable computer is operating, the inner electronic components that can generate heat, such as the central processing unit and the video-graphic chip, will produce a lot of heat, so the narrow inner space of the portable computer will worsen the heat dissipation in the computer. Once the heat generated by the inner parts of the portable computer can not be successfully dissipated outside, the inner temperature will surely increase, and when the temperature increases beyond the critical point that the inner parts can endure, the overheat shut-down will occur. Therefore, the heat dissipation is an important factor that has to be taken into account in portable computer designs.

In order to update the hardware components of the portable computer, in the conventional technology, a modularized interface card is usually mounted inside the portable computer via a card slot. Among others, the mini-PCI interface is a common interface card specification applied to the portable computer. According to the function to be updated from the interface card, the interface card usually has more than one heat-generating electronic component thereon. However, with the progresses of the IC design and fabrication process, the heat-generating power of the electronic components on the interface card becomes increasingly higher. Therefore, the heat dissipation issue of the electronic components on the interface card has to be solved.

FIG. 1 is a top view of a conventional heat dissipation structure coupled to an interface card, and FIG. 2 is a side view of FIG. 1. Referring to FIGS. 1 and 2, an interface card 100 (e.g. a mini-PCI interface card) includes a wired board 110 having a plug region 112 that can be plugged into a corresponding slot in a portable computer. Moreover, the interface card 100 further comprises multiple heat-generating electronic components 120, all of which are arranged on a unilateral surface 110a of the wired board 110. However, when the heat-generating electronic components 120 are operating, such an arrangement will cause the heat to accumulate on the unilateral surface 110a of the wired board 110 having the heat-generating electronic components 120.

Referring to FIGS. 1 and 2, in order to provide a solution of the heat dissipation problem of the interface card 100, in the conventional technology, a heat dissipation structure 200 is directly fixed above the surface 110a of the wired board 110 of the interface card 100. The heat dissipation structure 200 comprises a flat heat conduction portion 210, wherein the heat conduction portion 210 has a plurality of connection leads 214 fixed on the unilateral surface 110a of the wired board 110 by the surface mount technology (SMT). Moreover, the heat conduction portion 210 further has a plurality of contact leads 212 which are joined onto the surfaces of the heat-generating electronic components 120. Therefore, the thermal energy generated by each heat-generating electronic component 120 will be conducted to the heat conduction portion 210 via the plane contact leads 212 in contact with respective electronic components 120, and will be dissipated to the surroundings via heat convection. However, the conventional heat dissipation structure applied to the interface card has at least the following disadvantages, 1. The layout of the conventional technology, in which the heat-generating electronic components are incorporated with a unilateral surface of the heat dissipation structure, causes the heat source to excessively gather on the unilateral surface of the wired board of the interface card, such that the heat generated by the heat-generating electronic components can not be rapidly guided outside via the heat dissipation structure, therefore lowering the heat dissipation performance of the interface card.

2. The heat dissipation efficiency of the heat dissipation structure according to conventional technology is poor, so the interface card may fail due to the overheating of the heat-generating electronic components on the wired board of the interface card.

3. Since the heat dissipation of the interface card is not efficient in the conventional technology, the housing temperature of the portable computer increases, and accordingly, hot spots occur on the housing of the portable computer, thus making the user feel uncomfortable.

SUMMARY OF THE INVENTION

Accordingly, an object of the present invention is to provide a heat dissipation structure to enable the heat generated by the heat-generating electronic components on the wired board of the interface card to be effectively dissipated to the surroundings.

In order to achieve the aforementioned and other objects of the present invention, the present invention provides a heat dissipation structure configured to couple with an interface card, wherein the interface card has at least one wired board and at least a first heat-generating electronic component arranged on a first surface of the wired board. The heat dissipation structure comprises a first heat conduction portion, a second heat conduction portion and a heat convection portion. The first heat conduction portion is arranged above the first surface of the wired board and has a first contact lead which extends to the first heat-generating electronic component and is in contact with the first heat-generating electronic component. The second heat conduction portion is arranged above a second surface of the wired board opposite the first surface thereof. The heat convection portion connects the first and the second heat conduction portions by spanning an edge of the wired board, and further, the heat convection portion has a plurality of heat convection slots.

According to an embodiment of the present invention, the heat conduction portions have a plurality of connection leads which extend to a surface of the wired board of the interface card and are connected to the interface card by way of welding, riveting, fastening or screw locking.

According to an embodiment of the present invention, the heat conduction portions are in a flat shape.

According to an embodiment of the present invention, the heat convection portion comprises a plurality of first bending strips and a plurality of second bending strips that are alternatively arranged, wherein the heat convection slots are formed between the first bending strips and the second bending strips.

According to an embodiment of the present invention, the second bending strips are in a necking-down shape or in a helical shape.

According to an embodiment of the present invention, the first heat conduction portion, the second heat conduction portion and the heat convection portion are formed integrally.

According to an embodiment of the present invention, the first heat conduction portion, the second heat conduction portion and the heat convection portion are formed integrally by processing a single sheet of heat conducting material.

In summary, the heat dissipation structure applied to a interface card according to the present invention has at least the following advantages, 1. The heat dissipation structure of the present invention enables the heat generated by the heat-generating electronic components on the wired board of the interface card to be effectively dissipated, thus lowering the temperature and reducing the probability of the interface card failure which results from the overheating of the heat-generating electronic components.

2. The heat dissipation structure of the present invention enables the heat generated by the heat-generating electronic components on the wired board of the interface card to be effectively dissipated, thus preventing the heat from accumulating on the housing of the portable computer to generate hot spots and make the user uncomfortable.

In order to the make the aforementioned and other objects, features and advantages of the present invention more comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
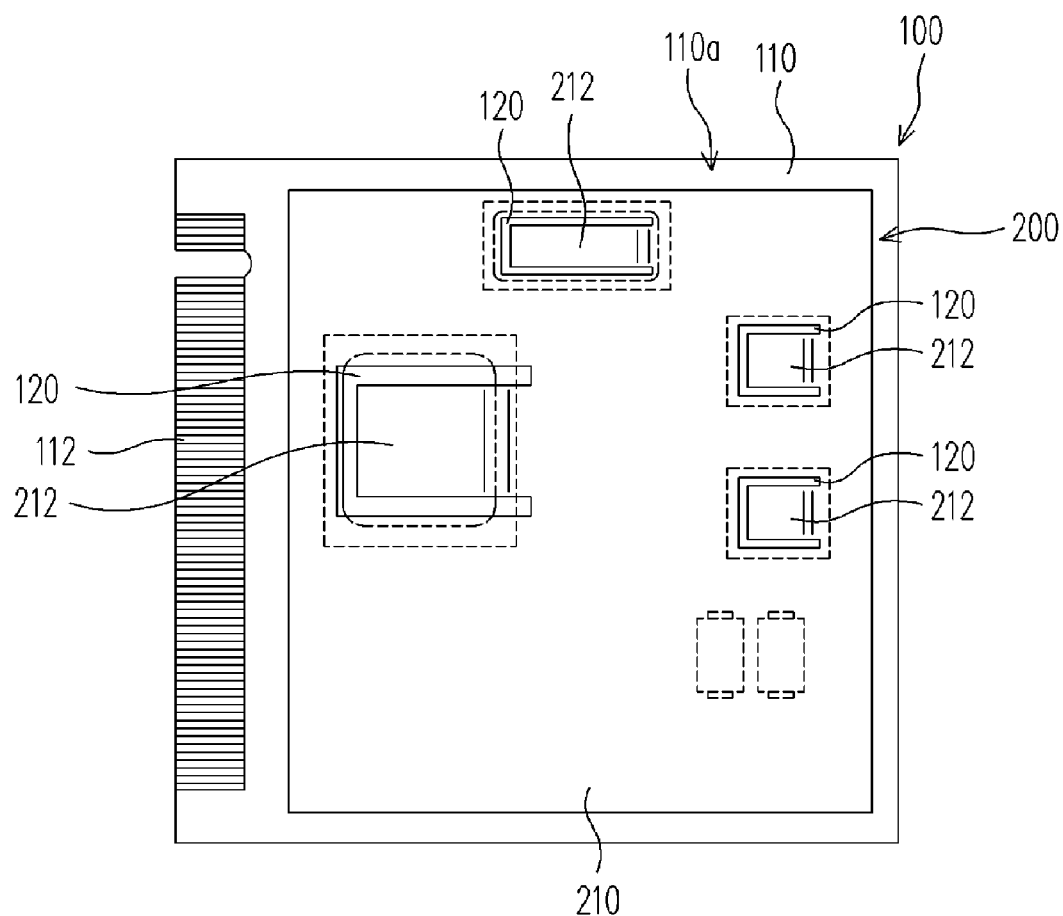
FIG. 1 is a top view of a conventional heat dissipation structure coupled to an interface card.
Figure 2:
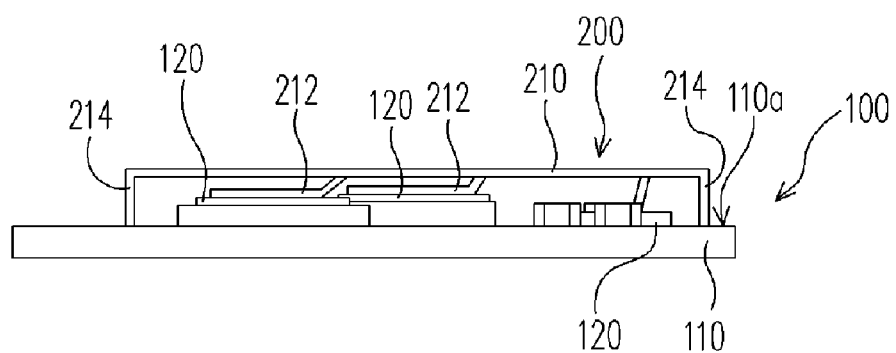
FIG. 2 is a side view of FIG. 1.
Figure 3:
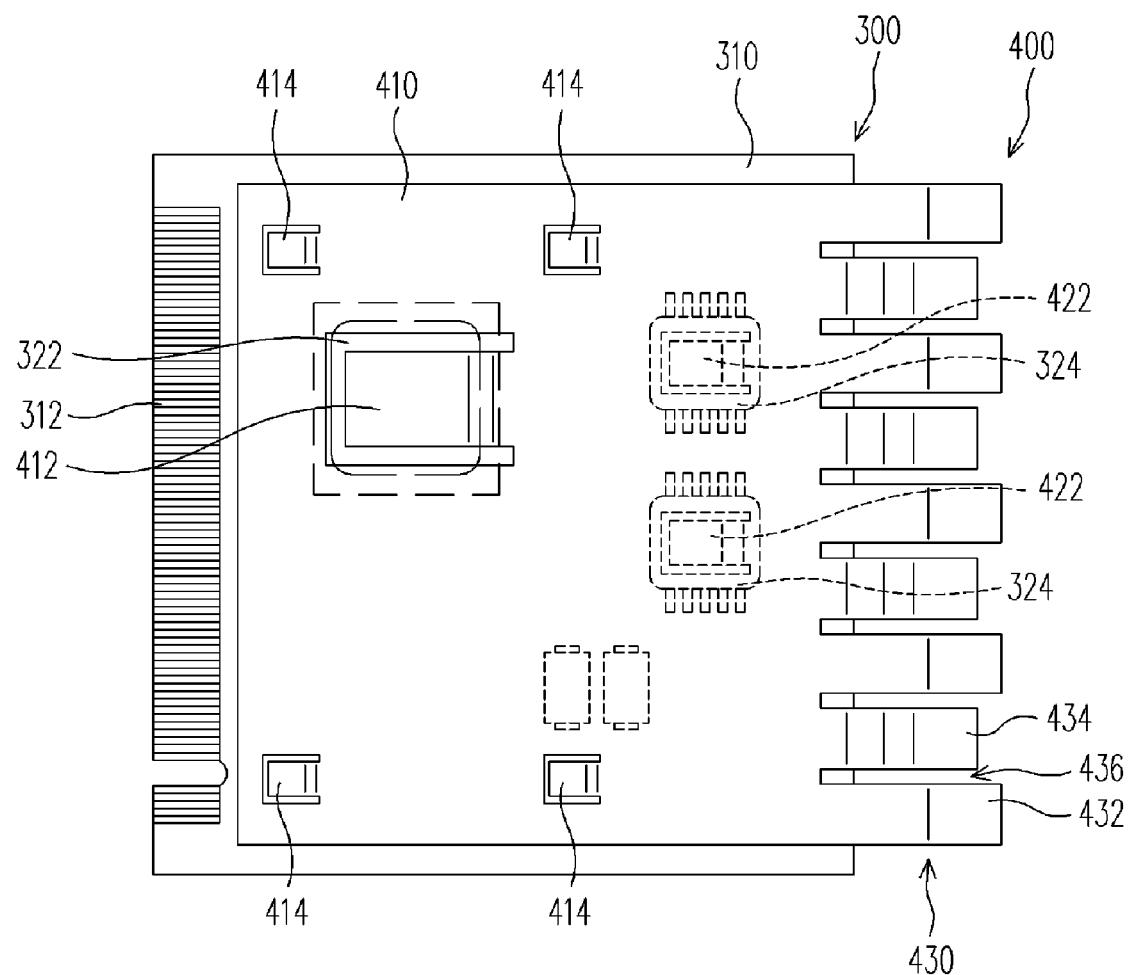
FIG. 3 is a top view of a heat dissipation structure coupled to an interface card according to an embodiment of the present invention.
Figure 4:
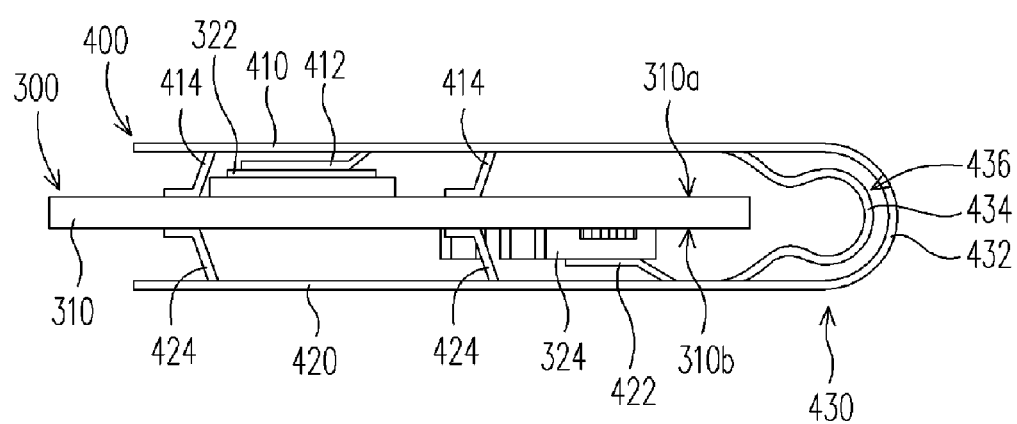
FIG. 4 is a side view of FIG. 3.

FIG. 3 is a top view of a heat dissipation structure coupled to an interface card according to an embodiment of the present invention and FIG. 4 is a side view of FIG. 3. Referring to FIG. 3 together with FIG. 4, an interface card 300 includes a wired board 310 which has a first surface 310a, a corresponding second surface 310b and a plug region 312 that can be plugged into a corresponding slot of the portable computer. The interface card 300 further has a first heat-generating electronic component 322 and multiple second heat-generating electronic components 324, wherein the first heat-generating electronic component 322 is arranged on the first surface 310a of the wired board 310, and the second heat-generating electronic components 324 are arranged on the second surface 310b of the wired board 310.

Unlike the conventional technology, in the layout of the interface card 300 according to the embodiment of the present invention, the heat-generating electronic components (including the first heat-generating electronic component 322 and the second heat-generating electronic components 324) are not all arranged on a single surface of the wired board 310, and may be arranged on either surface of the wired board 310 according to the power thereof. As shown in FIGS. 3 and 4, the first heat-generating electronic component 322 is arranged on the first surface 310a of the wired board 310, and the second heat-generating electronic components 324 are arranged on the second surface 310b of the wired board 310. With such a dispersed layout, the required multiple heat-generating components on the wired board 310 of the interface card 300 can be suitably allocated on the two surfaces of the wired board 310, such that the heat generated by the first heat-generating electronic component 322 and the second heat-generating electronic components 324 will not gather on a single side of the interface card 300 as it did in the conventional technology, and will be evenly dispersed on the two sides of the interface card 300.

Figure 5:
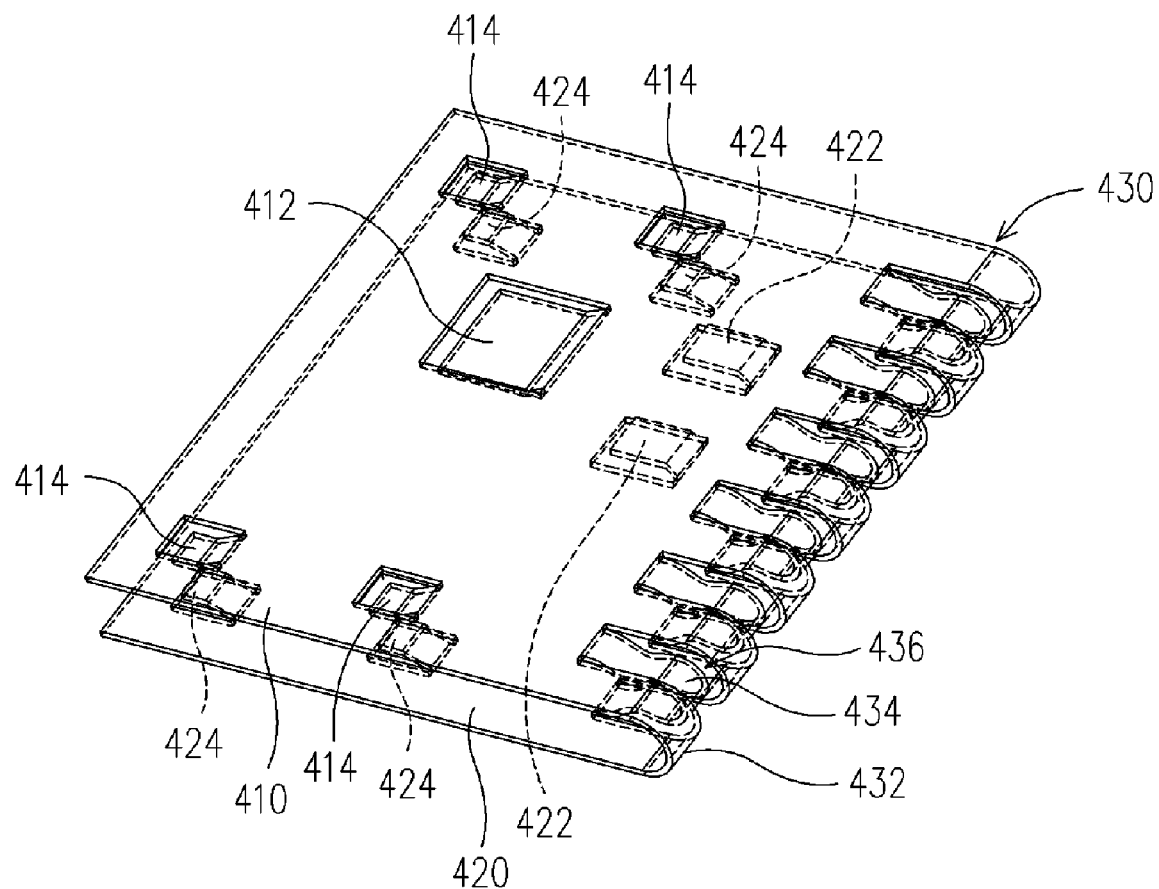
FIG. 5 is a perspective view of the heat dissipation structure of FIGS. 3 and 4.

FIG. 5 is a perspective view of the heat dissipation structure of FIGS. 3 and 4. Referring to FIGS. 3 and 4 together with FIG. 5, the heat dissipation structure 400 of the embodiment has a first flat heat conduction portion 410, a second flat heat conduction portion 420 and a bending heat convection portion 430, wherein a receiving space is formed between the first heat conduction portion 410 and the second heat conduction portion 420 to receive the interface card 300 to be coupled, and the heat convection portion 430 spans an edge of the wired board 310, wherein the first heat conduction portion 410 and the second heat conduction portion 420 are connected with each other by the heat convection portion 430.

The first heat conduction portion 410 is arranged above the first surface 310a of the wired board 310. The first heat conduction portion 410 has a first contact lead 412 which extends to the first heat-generating electronic component 322 and is configured to contact the first heat-generating electronic component 322 for guiding the heat out of the first heat-generating electronic component 322. Moreover, the second heat conduction portion 420 is arranged above the second surface 310b of the wired board 310, and the second heat conduction portion 420 has a plurality of second contact leads 422 which respectively extend to the second heat-generating electronic components 324 and are configured to respectively contact the second heat-generating electronic components 324.

The numbers of the first contact lead 412 and the second contact leads 422 can be respectively increased or decreased with the numbers of the first heat-generating electronic component 322 and the second heat-generating electronic components 324. Moreover, the fitness between the contact surfaces of the first contact lead 412 and the first heat-generating electronic component 322 and between the contact surfaces of the second contact leads 422 and the second heat-generating electronic components 324 can be enhanced by coating the thermal paste or adhering the thermal film to those contact surfaces, so as to reduce the thermal resistance generated due to the uneven surfaces, thus enhancing the heat dissipation efficiency.

The heat convection portion 430 comprises multiple first bending strips 432 and multiple second bending strips 434 that are alternatively arranged, and multiple heat convection slots 436 are formed between the first bending strips 432 and the second bending strips 434 to be used as the outlets and inlets of the air flow. In this embodiment, the second bending strips 434 are in a necking-down form, as shown in FIG. 4.

In order to couple the heat dissipation structure 400 to the interface card 300, the first heat conduction portion 410 and the second heat conduction portion 420 may further have multiple first connection leads 414 and multiple second connection leads 424 respectively. The first connection leads 414 and the second connection leads 424 are respectively secured on the first surface 310a and the second surface 310b by way of welding, riveting, fastening or screw locking. Moreover, in the fabrication of the heat dissipation structure 400, the material of the heat dissipation structure 400 is the common heat conducting material such as copper and aluminum, etc., and the heat dissipation structure 400 can be fabricated integrally from a single sheet of heat conducting material by way of punching, cutting and bending.

Figure 6:
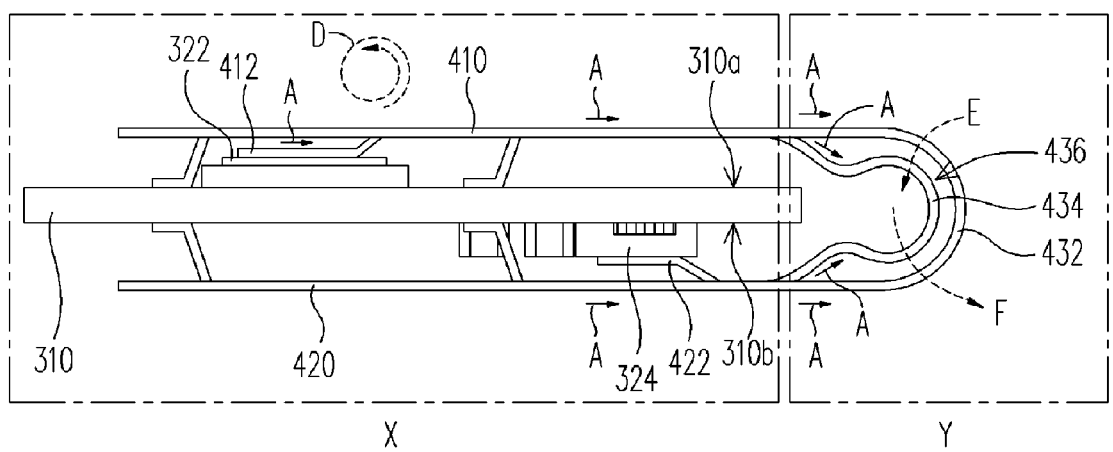
FIG. 6 is a schematic view of the heat dissipation path of the heat dissipation structure in FIG. 4.

FIG. 6 is a schematic view of the heat dissipation path of the heat dissipation structure in FIG. 4. The heat generated by the first heat-generating electronic component 322 on the first surface 310a of the wired board 310 is conducted to the first flat heat conduction portion 410 via the plane contact lead 412 which is in contact with the first heat-generating electronic component 322, and the heat generated by the second heat-generating electronic components 324 on the second surface 310b of the wired board 310 is conducted to the second flat heat conduction portion 420 respectively via the flat contact leads 422 which are in contact with the second heat-generating electronic components 324. Therefore, in the heat conduction region X, most of the heat, which is guided to the first heat conduction portion 410 and the second heat conduction portion 420 via the contact leads 412 and 422, is conducted from the first heat conduction portion 410 and the second heat conduction portion 420 towards the heat convection region Y in the heat conduction direction A by heat conduction. Part of the heat, in the process of conduction, conducts heat exchange with the surrounding air above the first heat conduction portion 410 and the surrounding air below the second heat conduction portion 420 by natural convection, as indicated by the dotted arrow D in the figure.

When the heat reaches the heat convection portion 430 within the heat convection region Y from the first heat conduction portion 410 and the second heat conduction portion 420, the forced convection effect may be generated with the heat dissipation design of the overall system, by utilizing the forced air flow generated by the system fan in the heat convection region Y, such that the cold air enters the slot in the convection direction E and becomes hot after exchanging heat with the heat convection portion 430 within the heat convection region Y, and then the hot air flows out of the heat convection region Y in the convection direction F. Thus, the purpose of removing the heat generated by the first heat-generating electronic component 322 and the second heat-generating electronic components 324 can be achieved. It should be noted that, in FIG. 6, the heat convection direction E and the heat convection direction F indicate the forced convection phenomenon which occurs in the heat convection region Y and do not limit the flow direction of the cold air and the hot air in a real situation.

Figure 7:
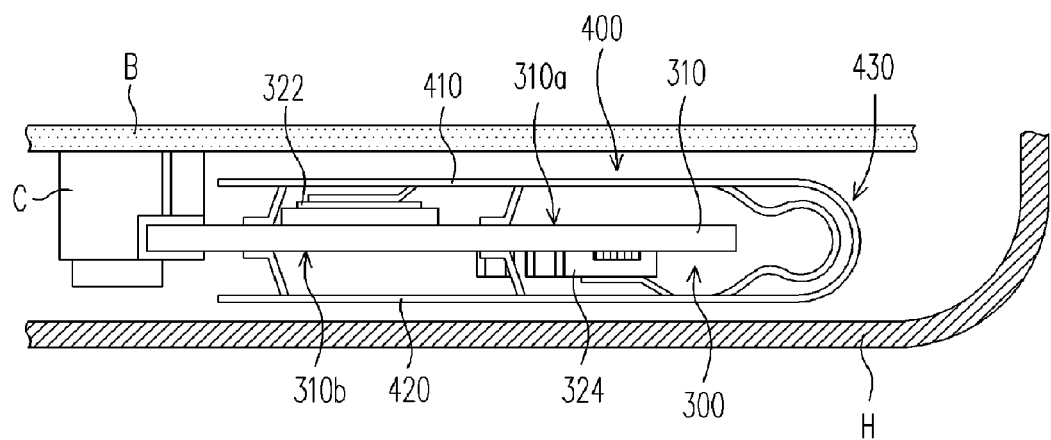
FIG. 7 is a schematic view of the interface card and the heat dissipation structure of FIG. 4 residing in a portable computer.

FIG. 7 is a schematic view of the interface card and the heat dissipation structure of FIG. 4 residing in the portable computer. Referring to FIG. 7, the interface card 300 coupled with the heat dissipation structure 400 is plugged into the slot C, which is arranged on the motherboard B by the plug region on the left side of the wired board 310. And the card 300 is located inside the housing H of the portable computer. Since the first heat-generating electronic component 322 and the first heat conduction portion 410 are arranged on the first surface 310a of the wired board 310, while the second heat-generating electronic components 324 and the second heat conduction portion 420 are arranged on the second surface 310b of the wired board 310, the heat sources (that is, the first and the second heat-generating electronic components 322 and 324) are enabled to be dispersed on the first surface 310a and the second surface 310b of the wired board 310, and the heat is conducted to the heat convection portion 430 by the first heat conduction portion 410 and the second heat conduction portion 420, and then rapidly dissipated by forced convection via the heat convection portion 430. Thus, the heat accumulation on the housing H can be reduced, i.e. the hot spots can be prevented from the housing H, making the user feel more comfortable when using the portable computer.

Figure 8:
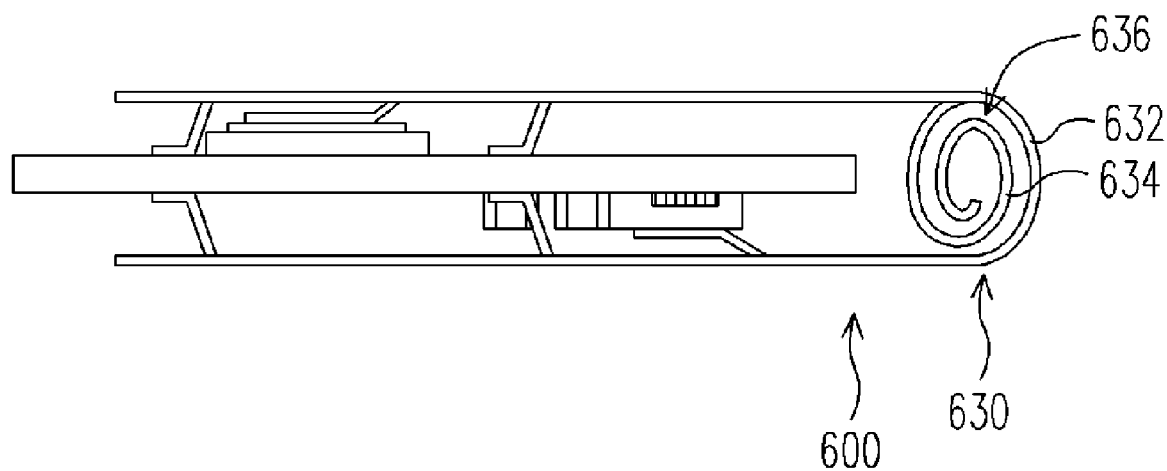
FIG. 8 is a side view of a heat dissipation structure coupled to an interface card according to another embodiment of the present invention.

FIG. 8 is a side view of a heat dissipation structure coupled to an interface card according to another embodiment of the present invention. Referring to FIG. 8, a second bending strip 634 of a heat convection portion 630 in a heat dissipation structure 600, compared with that in the heat dissipation structure 400 of FIG. 4, is not limited to the necking-down shape of the second bending strip 434 in FIG. 4 and can be processed into a helical shape. The advantage of processing the second bending strip 634 into a helical shape is that the surface area of heat dissipation can be increased, thus making the forced heat convection effect at a heat convection slot 636 more effective, thereby increasing the heat dissipation speed.

Of course, the first and the second bending strips of the heat convection region are not limited to the shapes in the above embodiments. Any design or shape of the strips can be employed as long as the surface area and the heat dissipation efficiency can be increased without excessive flow resistance which affects the heat dissipation air flow of the system.

In summary, the heat dissipation structure of the present invention can be applied to interface cards of all specifications (e.g. mini-PCI), or to other types of electronic cards or circuit boards. Moreover, the heat dissipation structure can strengthen efficient and rapid heat dissipation of the interface cards, enabling the interface cards to operate normally for a long time without causing the overheat shut-down. Moreover, when the interface card with the heat dissipation structure of the present invention is arranged inside the housing of the portable computer, the heat dissipation structure of the present invention together with the heat dissipation air flow of the system can rapidly remove the heat generated by the heat-generating electronic components of the interface cards, so the heat accumulation on the housing of the portable computer can be reduced, i.e. the hot spots can be prevented from the housing, making the user feel more comfortable when using the portable computer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation structure applied to an interface card, wherein the interface card has a wired board and a first heat-generating electronic component, and the first heat-generating electronic component is arranged on a first surface of the wired board, the heat dissipation structure comprising:
   a first heat conduction portion, arranged above the first surface of the wired board, wherein the first heat conduction portion has a first contact lead protruding from the first heat conduction portion to contact the first heat-generating electronic component, contacting part of the first contact lead, contacting the heat-generating electronic component, and the first heat conduction portion are in different levels respectively, an extending part of the first contact lead, connected between the contacting part and the first heat conduction portion, and the contacting part are internally formed, and the first heat conduction portion has a first connection lead protruding from the first heat conduction portion to connect the first surface of the wired board;
   a second heat conduction portion, arranged above a second surface of the wired board opposite the first surface; and
   a heat convection portion, crossing an edge of the wired board to connect the first heat conduction portion and the second heat conduction portion, wherein the heat convection portion has multiple heat convection slots.

2. The heat dissipation structure as claimed in claim 1, wherein the interface card further has a second heat-generating electronic component arranged on the second surface of the wired board, and the second heat conduction portion has a second contact lead protruding from the second heat conduction portion to contact the second heat-generating electronic component.

3. The heat dissipation structure as claimed in claim 1, wherein the first connection lead is welded, riveted, fastened or locked to the wired board.

4. The heat dissipation structure as claimed in claim 1, wherein the second heat conduction portion has a second connection lead protruding from the second heat conduction portion to connect the second surface of the wired board.

5. The heat dissipation structure as claimed in claim 4, wherein the second connection lead is welded, riveted, fastened or locked to the wired board.

6. The heat dissipation structure as claimed in claim 1, wherein the first heat conduction portion is in a flat shape.

7. The heat dissipation structure as claimed in claim 1, wherein the second heat conduction portion is in a flat shape.

8. The heat dissipation structure as claimed in claim 1, wherein the heat convection portion includes a plurality of first bending strips and a plurality of second bending strips alternatively arranged, and the heat convection slots are formed between the second bending strips and the first bending strips.

9. The heat dissipation structure as claimed in claim 8, wherein the second bending strip is in a necking-down shape.

10. The heat dissipation structure as claimed in claim 8, wherein the second bending strip is in a helical shape.

11. The heat dissipation structure as claimed in claim 1, wherein the first heat conduction portion, the second heat conduction portion and the heat convection portion are formed integrally of a single sheet.

12. A heat dissipation structure applied to an interface card, wherein the interface card has a wired board, a first heat-generating electronic component arranged on a first surface of the wired board, and a second heat-generating electronic component arranged on a second surface of the wired board opposite to the first surface, the heat dissipation structure comprising:
   a first heat conduction portion, arranged above the first surface of the wired board and having a first contact lead protruding from the first heat conduction portion to contact the first heat-generating electronic component, wherein a contacting part of the first contact lead contacting the heat-generating electronic component and the first heat portion are in different levels respectively, an extending part of the first contact lead, connected between the contacting part and the first heat conduction portion, and the contacting part are integrally formed, and the first heat conduction portion has a first connection lead protruding from the first heat conduction portion to connect the first surface of the wired board; and
   a second heat conduction portion, arranged above the second surface of the wired board connected with the first heat conduction portion and having a second contact lead protruding from the second heat conduction portion to contact the second heat-generating electronic component, wherein a contacting part of the second contact lead contacting the heat-generating electronic component and the second heat portion are in different levels respectively.

13. The heat dissipation structure as claimed in claim 12, wherein the first connection lead is welded, riveted, fastened or locked to the wired board.

14. The heat dissipation structure as claimed in claim 12, wherein the second heat conduction portion has a second connection lead protruding from the second heat conduction portion to connect the second surface of the wired board.

15. The heat dissipation structure as claimed in claim 14, wherein the second connection lead is welded, riveted, fastened or locked to the wired board.

16. The heat dissipation structure as claimed in claim 12, wherein the first heat conduction portion is in a flat shape.

17. The heat dissipation structure as claimed in claim 12, wherein the second heat conduction portion is in a flat shape.

* * * * *